United States Patent
Schön et al.

(10) Patent No.: US 10,422,840 B2
(45) Date of Patent: Sep. 24, 2019

(54) FLAT INSULATION LAYER FOR A MAGNETIC RESONANCE GRADIENT COIL AND METHOD FOR MANUFACTURING SUCH A GRADIENT COIL AND A FLAT INSULATION LAYER

(71) Applicant: Siemens Healthcare GmbH, Erlangen (DE)

(72) Inventors: Lothar Schön, Neunkirchen (DE); Stefan Stocker, Grossenseebach (DE)

(73) Assignee: Siemens Healthcare GmbH, Erlangen (DE)

( * ) Notice: Subject to any disclaimer, the term of this patent is extended or adjusted under 35 U.S.C. 154(b) by 105 days.

(21) Appl. No.: 15/637,009

(22) Filed: Jun. 29, 2017

(65) Prior Publication Data
US 2018/0011157 A1    Jan. 11, 2018

(30) Foreign Application Priority Data
Jul. 5, 2016   (DE) .......................... 10 2016 212 225

(51) Int. Cl.
*G01R 33/385*   (2006.01)

(52) U.S. Cl.
CPC ..... *G01R 33/3856* (2013.01); *G01R 33/3858* (2013.01)

(58) Field of Classification Search
None
See application file for complete search history.

(56) References Cited

U.S. PATENT DOCUMENTS

2014/0035585 A1*  2/2014  Schuster .............. G01R 33/381
                                                        324/322

FOREIGN PATENT DOCUMENTS

DE       10246363  A1      4/2004
DE       10315539  A1     10/2004

OTHER PUBLICATIONS

Machine English Translation of DE 103 15 539 (Year: 2004).*
Machine English Translation of DE 102 46 363 (Year: 2004).*

* cited by examiner

*Primary Examiner* — Douglas X Rodriguez
(74) *Attorney, Agent, or Firm* — Schiff Hardin LLP

(57) ABSTRACT

In a method for manufacturing a flat insulation layer for use in a gradient coil, a thermoplastic insulating material in the form of a plate, strip or foil is three-dimensionally deformed in a hot shaping step to form specified local elevations on at least one side, which are spaced apart from one another.

9 Claims, 4 Drawing Sheets

FLAT INSULATION LAYER FOR A MAGNETIC RESONANCE GRADIENT COIL AND METHOD FOR MANUFACTURING SUCH A GRADIENT COIL AND A FLAT INSULATION LAYER

BACKGROUND OF THE INVENTION

Field of the Invention

The invention concerns a method for manufacturing a flat insulation layer for use in a magnetic resonance gradient coil, and a flat insulation layer of such a gradient coil.

Description of the Prior Art

A gradient coil is component of the data acquisition scanner of a magnetic resonance imaging apparatus. It is used to generate local gradient fields for spatially encoding the magnetic resonance signals. Corresponding coils are required for this purpose, in order to generate respective gradient fields in spatial directions orthogonal to one another. These coils are arranged in a number of radial layers, i.e. their electrical conductors proceed in designated radial layers. To insulate the coils from one another and space them a defined distance apart from one another, insulation layers are inserted between the layers of the radial coils. This ensures that the interspaces have an electrical insulation effect that is as high as possible, in order to insulate the coils from one another. This multilayer structure is then embedded into an epoxy resin matrix using a vacuum casting process. The goal is for the epoxy resin to fully embed all components and in particular to fill all hollow spaces, since otherwise problems culminating in inoperability may result from such faulty casting regions. For this reason it is necessary to configure the insulation layers such that a flow of the casting resin is possible in the axial direction, but at the same time the insulation layers must be designed to be thin enough so that the gap dimension required is as small as possible, and consequently the gradient coil is mounted low in the respective insulation layer, when viewed radially.

It is known for glass-reinforced laminate plates to be used as insulation layers, with a nub structure integrally molded on at least one side thereof. Such glass-reinforced laminate plates are complicated to manufacture. Different layers of glass-fiber matting are laid over one another, these layers normally already being pre-impregnated with a resin. In this arrangement a correspondingly large reservoir of resin must be held, so as to be able to form the nub structure. This is done by pressing a pile of the matting in a press, the press molds having the negative geometry of the relevant side of the plate, and consequently having corresponding recesses that serve to form the nubs. The nubs themselves are formed by the resin that is heated and flows during pressing; the resin flows into the recesses.

The manufacture of such glass-reinforced laminate plates is obviously very complicated and requires special fiber matting and press molds.

SUMMARY OF THE INVENTION

An object of the invention is to provide a method for manufacturing such an insulation layer that is simpler in comparison with such known method.

This object is achieved by a method according to the invention for manufacturing a flat insulation layer for use in a gradient coil, in which a thermoplastic insulating material in the form of a plate, strip or foil is deformed three-dimensionally in a hot shaping step, in order to form specified local elevations on at least one side, which local elevations are spaced apart from one another.

The inventive method makes use of simple thermoplastic semi-finished parts in the form of a plate, strip or foil. A material is used that has sufficient insulating properties, but which is also sufficiently temperature-resistant in view of the intended purpose. This thermoplastic plate, strip or foil material is inventively shaped in a simple hot shaping step using a heatable mold. In this hot shaping step, the thermoplastic material is three-dimensionally shaped to form given local elevations on at least one side. Thus a type of deep drawing or deep pressing takes place. Since the material is only shaped, no flow of the material occurs. Each elevation on the one side is opposed by a correspondingly shaped depression on the opposing side. The components shaped in this way can then be immediately used as insulation layers and incorporated into a gradient coil.

This hot shaping is a considerably simpler and quicker process, and no special measures need be taken in order to work the material in the first place to form an insulation layer. This is in contrast to the glass-reinforced laminate plates described above, which cannot be manufactured until the corresponding layer structure stage. Instead, a corresponding prefabricated semi-finished part is inventively used. In the case of a plate, hot shaping to process the respective plate-shaped individual component takes place in a corresponding mold. In the case of a continuous strip or a foil a continuous shaping operation can also take place, using corresponding rotating shaping rollers and the like.

Suitable thermoplastics, of which the plate, strip or foil material consist, have a sufficiently high hot molding resistance in order to remain mechanically stable during the casting and curing process and to maintain the spacings between the individual coil layers. It is further advantageous for the casting resin used to have good adherence to the thermoplastic surface, in order to maintain the mechanical integrity of the gradient coil even during operation.

Suitable thermoplastics are in the following groups of materials:

POM (polyoxymethylene), PA (polyamide), PET (polyethylene terephthalate), PBT (polybuthylene terephthalate), PC (polycarbonate), PMMA (polymethyl methacrylate), ABS (acrylonitrile butadiene styrene), SAN (styrene acrylonitrile), PUR (polyurethane).

Furthermore, polymer blends or copolymers can also be used.

In principle the thermoplastics can also contain additives such as mineral fillers, in order to improve particular properties such as hot molding resistance or thermal conductivity. For example, these can be particle-shaped, fiber-shaped or plate-shaped fillers. In this case thermoplastic elastomers that in pure form do not possess sufficient rigidity can also be employed as a basic polymer. Due to a high degree of filling, the hot molding resistance is significantly increased. Suitable thermoplastic elastomers are structured on the basis of polyamide, copolyester, polystyrene or polyurethane, for example.

The elevations can be nub-like, for example, with a round or angular geometry or cross-section. The nubs preferably taper somewhat toward their free end, such that they can easily be demolded from the respective shaping tool. Alternatively, elevations that are web-like and run straight or curved can also be formed.

Regardless of the geometry, a flow of resin in the axial direction is possible in each case during casting. This is because, as described, the elevations are spaced apart from one another, i.e. they do not abut one another, so that in each case there is an open flow path everywhere in the axial direction. At the same time the elevations permit a corresponding spacing of the gradient coils from one another.

Although the elevations can be formed on only one side, and consequently solely depressions are provided on the other side, it is equally conceivable for the elevations to also be formed on both sides, so that elevations and corresponding compatibly shaped depressions are provided on both sides.

If the semi-finished part is provided with elevations on both sides, the elevations on one side can be offset in rows, viewed in the transverse direction of the plate, strip or foil, with respect to the elevations on the other side. Thus, viewed in the longitudinal direction of the insulation layer, rows of adjacent elevations and rows of adjacent depressions are provided. For example, the rows of elevations and the rows of depressions can alternate. This is optional, not mandatory. Any other distributions are also conceivable. For example, an elevation and a depression can alternate in each row, the elevations and depressions of two adjacent rows being in turn offset in respect of one another.

It is expedient when integrating the insulation layers for insulation layers abutting one another in the axial direction to be fastened axially to one another, or secured to one another when viewed axially. To enable this even when using an inventively manufactured layer, in an embodiment of the invention longitudinal depressions or recesses are formed at an edge region running in the longitudinal direction of the plate, strip or foil, and spaced apart from one another. Special geometries are provided only at one of the edge regions, such as either longitudinal, groove-like depressions or longitudinal recesses, i.e. elongated holes. The elevations at the edge of the adjacent insulation layer can engage in these depressions or recesses if two adjacent insulation layers are now positioned with a slight overlap. A type of form-fit then occurs, such that two adjacent insulation layers are connected to one another. The arrangement of the longitudinal depressions and recesses should be selected in accordance with the arrangement of the elevations provided at the edge of the adjacent insulation layer, so that there is a corresponding engagement.

Since the insulation layers, be they plates, strips or foils, are all embodied identically, such an insulation layer consequently has the longitudinal depressions or recesses at one edge, whereas the elevations are provided at the other edge. The number of elevations can also be reduced in this region, compared to the number of elevations in the rest of the surface, so that there is a matching number of edge-side elevations and edge-side depressions.

Besides the method, the invention further concerns an insulation layer, manufactured by a method of the type described above.

The invention further relates to a method for manufacturing a cylindrical gradient coil, composed of multiple sub-coils that are arranged in different radial planes, and between which are arranged insulation layers, the coils and the insulation layers being cast using a curable resin, insulation layers of the inventive shape described above being used.

In the manufacturing process the insulation layers of an insulation plane can be arranged or wound around the longitudinal axis of the gradient coil, the insulation layers wound adjacent to one another overlapping at the edge.

If insulation layers that have longitudinal depressions or recesses at the edge are used, then in the context of the inventive method the insulation layers are arranged or wound such that elevations at the edge of one insulation layer engage in longitudinal depressions or recesses at the edge of the adjacent other insulation layer and in this way an axially secured insulation layer bonding is produced.

Besides the manufacturing method, the invention further also relates to a gradient coil, manufactured in accordance with the method of the described type.

DESCRIPTION OF THE PREFERRED EMBODIMENTS

Figure 1:
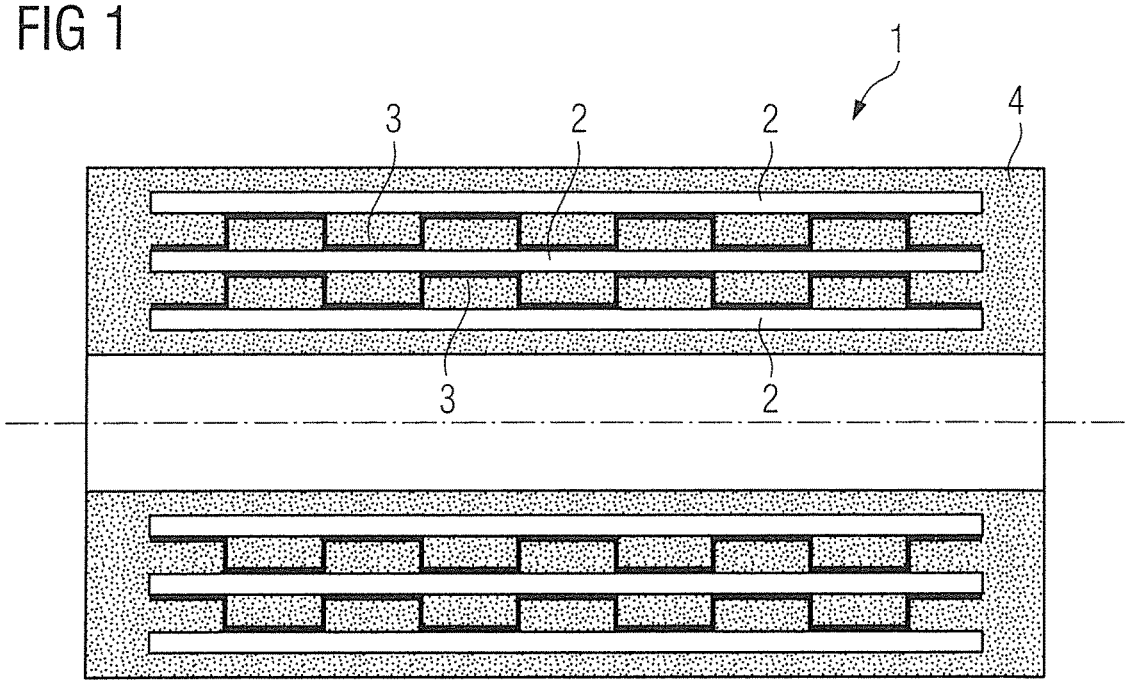
FIG. 1 shows a basic illustration of a gradient coil in cross-section.

FIG. 1 shows, in the form of a basic illustration, a sectional view of a gradient coil 1, having a number of gradient coils 2, between which insulation layers 3 are arranged, via which the gradient coils 2 are insulated and spaced apart from one another. This structure is cast in an epoxy resin 4, which defines the shape of the coil. The basic structure of a gradient coil is sufficiently known.

Figure 2:
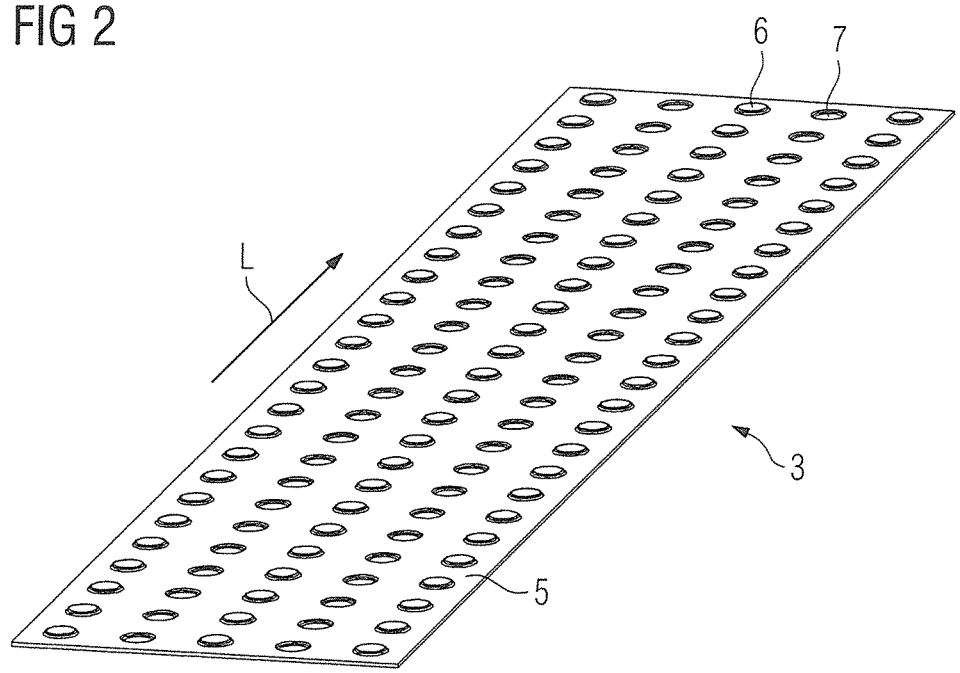
FIG. 2 shows a partial view of an inventive insulation layer.

FIG. 2 shows a basic illustration of an insulation layer of a first embodiment. This insulation layer consists of a thermoplastic material 5 in the form of a plate, strip or foil. Use can be made for example of polybuthylene terephthalate, polyoxymethylene, polyamide or polyethylene terephthalate, this list not being exhaustive.

The insulation layer 3 is manufactured from a semi-finished part in the form of a plate, strip or foil from the thermoplastic material by hot shaping using a corresponding shaping tool, not described in greater detail here. This can for example be a press in the case of individual plates or corresponding press rollers in the case of continuously shaped strips or foils.

In the reshaping process a three-dimensional change in shape takes place to form elevations 6 and depressions 7, the elevations 6 on one side necessarily resulting in compatibly shaped depressions 7 on the other side, since the hot reshaping process results only in a change in geometry, but not in a flow of material. The elevations 6 are, for example, round nubs or the like, and accordingly the depressions 7 are round and cup-like.

In the exemplary embodiment shown the elevations 6 and the depressions 7 are obviously arranged in rows which extend in the longitudinal direction L of the insulation layer 3, rows of elevations 6 and depressions 7 alternating. However, any other geometries can also be selected, for example elevations 6 and depressions 7 can alternate within a row, and the like.

In each case the elevations 6 are spaced apart from one another on the respective sides, such that a casting resin, i.e.

the epoxy resin 4, can flow in virtually any direction along the surfaces of the insulation layer 3. This ensures that in the vacuum casting process the epoxy resin 4 penetrates to every point that is to be cast with epoxy resin 4, such that no hollow spaces and similar casting faults are formed.

Figure 3:
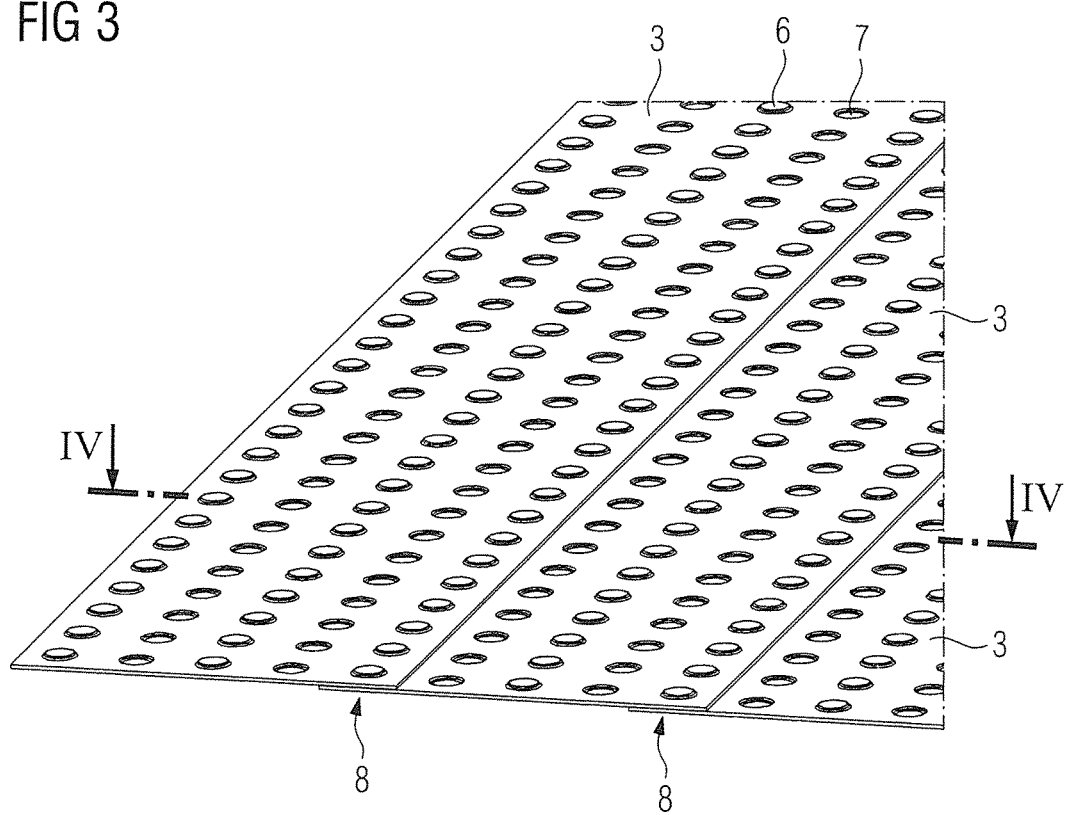
FIG. 3 shows a basic illustration of a number of insulation layers arranged next to one another in an overlapped arrangement.

FIG. 3 shows, as an example, the arrangement of a number of insulation layers 3 next to one another. The insulation layers 3 can be either separate stable plates, which are embodied as virtually semicircular in shape, extending around approx. 180°. If the insulation layers 3 are embodied in the form of strips or foils, they are as it were unwound from a long strip winding or foil winding and wound around the longitudinal axis of the gradient coil.

Figure 4:
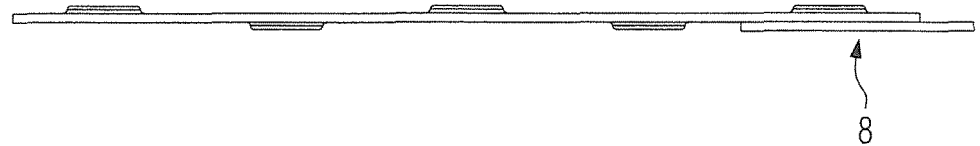
FIG. 4 shows a sectional view in the direction of the line IV-IV in FIG. 3.

In each case the arrangement of the insulation layers 3 is such that they overlap somewhat at the edge, and consequently an overlap zone 8 is produced, as shown in FIG. 3 and in particular in the sectional view according to FIG. 4. The arrangement here is such that the elevations 6 at the edge of the insulation layer 3 lying at the bottom engage in the opposing depressions of the insulation layer 3 lying on top. If the insulation layers 3 are laid around the gradient coil axis, then as a result of this form-fit engagement—the geometry of the elevations 6 corresponds to the geometry of the opposing depressions—the bonding of the layers is axially ensured, and an axial movement is consequently not possible.

Figure 5:
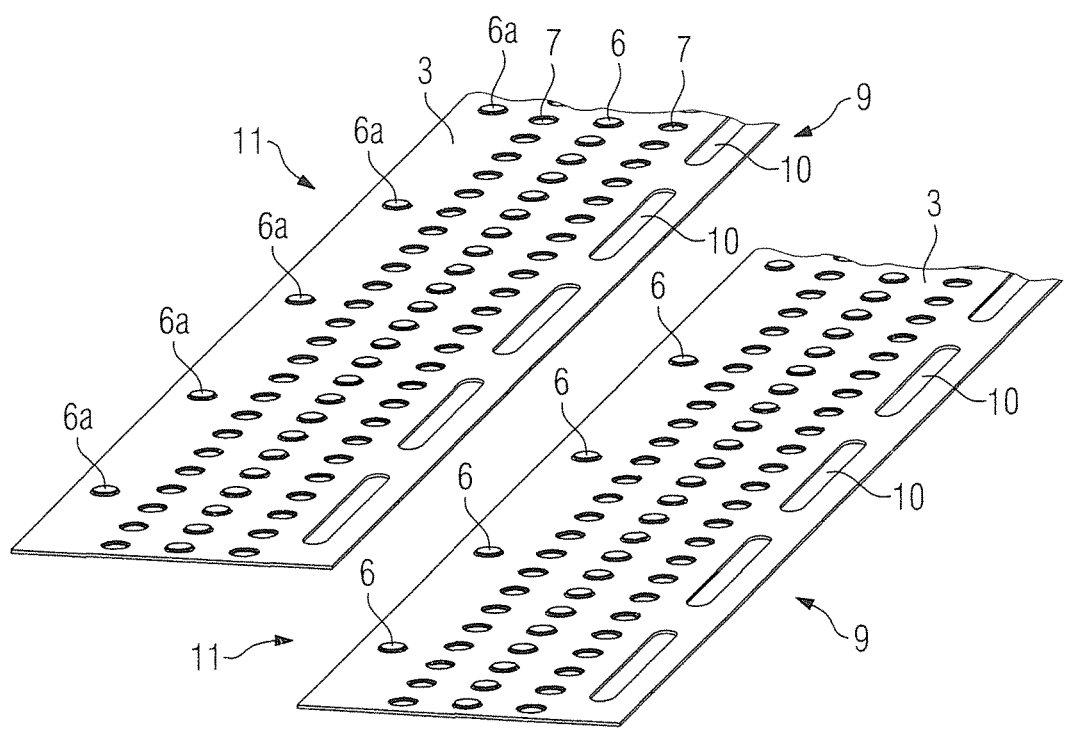
FIG. 5 shows two insulation layers of a second inventive embodiment.
Figure 6:
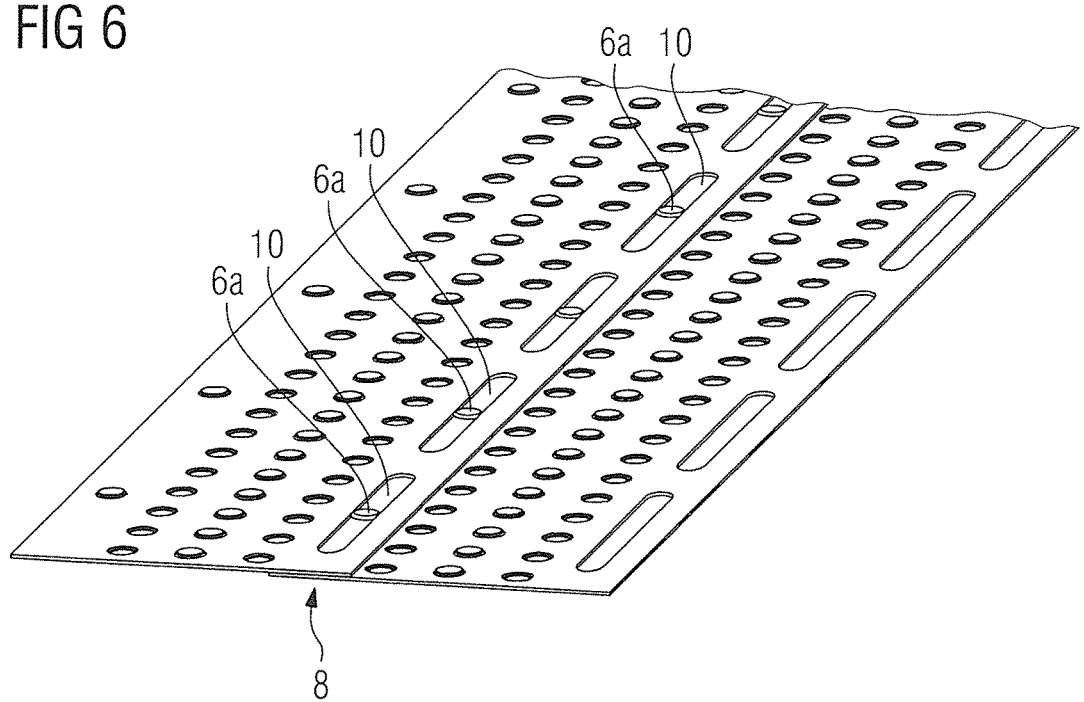
FIG. 6 shows the two insulation layers from FIG. 5 in an assembled mounting position.

Because of the defined spacing of the elevations 6 and depressions 7 from one another, the engagement of the nub-like elevations 6 into the corresponding depressions 7 requires the insulation layers 3 to be arranged on a defined radius, and consequently to be positioned in a very specific radial plane. To have sufficient clearance to also be able to position the insulation layers 3 in other radial planes, it is conceivable, as shown in FIGS. 5 and 6, to form longitudinal recesses 10, i.e. elongated holes, on an edge side 9, which extend in the longitudinal direction of the insulation layer 3. Alternatively to the recesses 10, it is also conceivable to form longitudinal elevations which necessarily result on the underside in corresponding longitudinal groove-like depressions.

At the opposing edge region 11 a number of elevations 6a corresponding to the number of recesses 10 or longitudinal depressions is formed on each insulation layer, again nub-like in the example shown.

As the example further shows, elevations 6 and depressions 7 are arranged over the rest of the surface in the manner already known from FIG. 2, i.e. the number of elevations 6/depressions 7 over the surface is significantly larger than the number of the few elevations 6a in the edge region 11.

If now two insulation layers 3 are arranged next to one another, forming an overlap region 8, be they plates, strips or foils, the elevations 6a formed in the region of the edge section 11 engage in the corresponding longitudinal recesses 10, as shown in FIG. 6. Since the recesses 10 are longitudinal, i.e. represent elongated holes, it is not a matter of the exact positioning of the elevations 6a relative to the recesses 10, i.e. these insulation layers can be integrated in different radial planes.

Even though round elevations are shown in the figures, that rise slightly conically from the plane, angled elevations or longitudinal, web-like or rib-like elevations are of course also conceivable. All that is important is that in both spatial directions they are spaced far enough apart from one another so that a flow of resin is possible in any direction during the vacuum casting.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for manufacturing an insulation layer for a magnetic resonance gradient coil, said method comprising:
    providing a plate, strip or foil of thermoplastic insulating material to a hot press apparatus;
    in said hot press apparatus, three-dimensionally deforming said thermoplastic insulating material of said plate, strip or foil in order to form predetermined elevations in said plate, strip or foil on at least one side of said plate, strip or foil, that are spaced apart from each other, and thereby simultaneously forming coinciding recesses at an opposite side of said plate, strip or foil; and
    said plate, strip or foil comprising respective peripheral edge regions at opposite edges of said plate, strip or foil, and forming said elevations and recesses at each of said peripheral edge regions so as to proceed in a longitudinal direction of said plate, strip or foil and wherein a number of the elevations and recesses at each of said peripheral edge regions is equal.

2. A method as claimed in claim 1 comprising forming said elevations as nubs each with a round or angled geometry, distributed in a web and proceeding in said web along a straight line or a curved line.

3. A method as claimed in claim 1 comprising forming said elevations in said hot press apparatus on both sides of said plate, strip or foil, and thereby also forming said coinciding recesses on both sides of said plate, strip or foil.

4. A method as claimed in claim 3 comprising forming said elevations on one side of said plate, strip or foil so as to be offset in rows, viewed in a transverse direction of said plate, strip or foil, with respect to the elevations on the other side of said plate, strip or foil.

5. An insulation layer manufactured by the method as claimed in claim 1.

6. A method for manufacturing a cylindrical magnetic resonance gradient coil assembly comprising:
    arranging a plurality of gradient coils respectively in different radial planes;
    providing an insulation layer between respective adjacent gradient coils in said plurality of gradient coils said insulation layer comprising a plate, strip or foil of thermoplastic insulating material having a plurality of elevations on at least one side thereof formed by three-dimensionally deforming said plate, strip or foil by hot shaping, said elevations being spaced apart from each other, said plate, strip or foil comprising respective peripheral edge regions at opposite edges of said plate, strip or foil, and forming said elevations and recesses at each of said peripheral edge regions so as to proceed in a longitudinal direction of said plate, strip or foil and wherein a number of the elevations and recesses at each of said peripheral edge regions is equal; and
    casting said plurality of gradient coils and said insulation layers with a curable resin that flows around the elevations of each insulation layer.

7. A method as claimed in claim 6 wherein said plurality of gradient coils define a cylinder with a longitudinal axis, and wherein each of said insulation layers comprises more than one plate, strip or foil all proceeding around said longitudinal axis and overlapping each other at said respective peripheral edges regions of each plate, strip or foil.

8. A method as claimed in claim 7 wherein the elevations of one plate, strip or foil in the insulation layer engaging in the depressions or recesses of another plate, strip or foil in the same insulation layer.

9. A gradient coil manufactured by the method as claimed in claim 6.

* * * * *